US006744389B2

(12) United States Patent
Haeberli et al.

(10) Patent No.: US 6,744,389 B2
(45) Date of Patent: Jun. 1, 2004

(54) A/D-CONVERTER WITH LOOKUP TABLE

(75) Inventors: Andreas Martin Haeberli, Wetzikon (CH); Urs Martin Rothacher, Zürich (CH); Felix Martin Mayer-Friedrich, Zürich (CH)

(73) Assignee: Sensirion AG, Zurich (CH)

( * ) Notice: Subject to any disclaimer, the term of this patent is extended or adjusted under 35 U.S.C. 154(b) by 0 days.

(21) Appl. No.: 10/182,887

(22) PCT Filed: Jan. 15, 2001

(86) PCT No.: PCT/IB01/00030
§ 371 (c)(1),
(2), (4) Date: Oct. 22, 2002

(87) PCT Pub. No.: WO01/58019
PCT Pub. Date: Aug. 9, 2001

(65) Prior Publication Data
US 2003/0132866 A1 Jul. 17, 2003

(30) Foreign Application Priority Data
Feb. 4, 2000 (CH) ................................................ 220/00

(51) Int. Cl.⁷ ............................................... H03M 1/10
(52) U.S. Cl. .................... 341/118; 341/143; 73/861.01; 702/86
(58) Field of Search .................... 341/118–121, 143, 341/155; 702/50, 86, 87, 88, 138, 199; 73/861.01, 861.02, 861.03

(56) References Cited

U.S. PATENT DOCUMENTS 4,097,860 A * 6/1978 Araseki et al. ............. 341/118
4,403,296 A * 9/1983 Prosky ......................... 702/86
4,707,798 A   11/1987 Nakano ....................... 364/765
4,918,995 A * 4/1990 Pearman et al. .......... 73/861.02
4,986,243 A   1/1991 Wessler, II et al. .......... 123/488
5,815,418 A * 9/1998 Dolazza et al. ............... 702/86

FOREIGN PATENT DOCUMENTS

EP        0309644      4/1989      ............ G01F/1/05
EP        0514587      11/1992     ............ H03M/1/06
EP        0889386      1/1999      ............ G06F/1/035
JP        11190653     7/1999      ............ G01F/15/04

OTHER PUBLICATIONS

Malcovati et al., "Smart Sensor Interface with A/D Conversion and Programmable Calibration," IEEE Journal of Solid–State Circuits, vol. 29, No. 8, Aug. 1994.

Machul et al., "A Smart Pressure Transducer with On–Chip Readout, Calibration and Nonlinear Temperature Compensation Based on Spline–Function," IEEE International Solid–State Circuits Conference (ISSCC 97), pp. 198–199, Feb. 7, 1999.

* cited by examiner

*Primary Examiner*—Howard L. Williams
(74) *Attorney, Agent, or Firm*—Donald S. Dowden; Cooper & Dunham LLP

(57) ABSTRACT

The A/D-converter with optional analog preprocessing comprises two analog inputs (I1, I2), wherein a converter (1, 2) is connected to each input for generating a first and a second digital value (D1, D2) respectively. These are fed to a table (3) for generating a lookup value (D). A decimation filter (4) processes several such lookup values and generates an output value (O). With this arrangement the table can be kept comparatively small while it is still possible to reach high resolution and precision. The A/D-converter is especially suited for applications where two or more analog signals have to be combined and digitized.

15 Claims, 2 Drawing Sheets

A/D-CONVERTER WITH LOOKUP TABLE

CROSS REFERENCE TO RELATED APPLICATIONS

This application claims the priority of Swiss patent application 0220/00, filed Feb. 4, 2000, the disclosure of which is incorporated herein by reference in its entirety.

BACKGROUND

The invention relates to an A/D-converter.

The invention relates to and A/D-converter according to the preamble of the independent claims.

For handling and processing measured values it is often necessary to combine several input signals with each other for obtaining a desired output signal. For example, pressure and flow sensors are usually dependent on temperature such that their signal has to be corrected in view of the present temperature. This is usually carried out in digital computing units.

For this purpose, all measured signals are usually first digitized and then combined using calculations or by means of a table. However, if they are combined by means of a calculation, multiplications and divisions have to be carried out, which is only possible in complicated circuits. Similarly, tables, if used, become also very large for high resolution. For reducing the table size, interpolation between table values can be used, but this again requires multiplications or divisions.

SUMMARY OF THE INVENTION

Hence, it is an object of the invention to provide an A/D-converter of the type mentioned above that is able to combine two or more analog input values and to generate an output value of high precision while the required circuitry remains as small as possible.

This object is met by the A/D-converter according to the invention.

This object is met by the A/D-converter according to claim 1.

Hence, according to the invention a converter generating a digital value is attributed to each input. The digital values of all converters are fed together to a table and are converted to a lookup value. Several consecutive lookup values are then filtered in a decimation filter, e.g. by adding or averaging, in order to generate an output value that has higher resolution than the lookup value. This architecture allows to use a converter of comparatively low resolution, which reduces the size of the table and allows to keep the whole circuit small because the combination of the two or more input signals is also carried out at low resolution. Only by the addition or averaging or filtering after the table the desired resolution is reached.

The table is preferably organized as a memory, but it can also be implemented as an arithmetic unit.

As the table will usually generate a non-linearity between input and output signal, offset compensation of the circuit is preferably implemented by correcting the digital values with a correction value between the converters and the table.

In a further aspect, the invention has the object to provide an A/D-converter of the type mentioned above that has one or two inputs and that allows an efficient offset correction.

In a further aspect, the invention has the object to provide an A/D-converter of the type mentioned above that has one or two inputs and that allows an efficient offset correction. This object is also achieved by the independent claims.

For this purpose, the digital values between the converter and the table are also corrected by a correction value. The correction value can be determined by applying a known analog input value (preferably 0 volt) to the corresponding converter—and, where applicable, a analog stage arranged before the converter, which analog stage is considered to be part of the converter—and the offset of the corresponding digital value is compared to its expected value. For increasing the resolution of the correction, the offsets of n digital values are added for generating a correction word k. The value of k/n rounded to the next lower integer, i.e. the value k div n, is then used for offset compensation of each digital value. To further increase resolution, the value k mod n, i.e. the remainder of the division, can be added for the correction of a group of n digital values to be corrected, by correcting part of the digital values of the group. Preferably, k mod n digital values of the group are corrected by a value of 1. In order to simplify this mathematical operations, n is preferably an integer power of 2.

The following embodiments relate to both aspects of the invention.

Preferably, circuits having a digitizer that converts the input value to a series of binary values are used as converters, wherein the number of the binary values with value 1 is proportional to the input value. By counting the binary values during a measuring period, the desired digital value can be generated. Examples for such converters are incremental converters or $\Sigma\Delta$-converters.

When using such converters, the table can generate difference values that are accessed upon each increment of a counter and added to the value of an integrator stage used as decimation filter. Preferably, a proportionality constant is added at the same time such that the table only needs to store the deviations in respect to a corresponding linear interpolation, which further reduces memory requirements.

In order to reduce the number of accesses to the table, the table can be driven using a cache circuit having an intermediate storage for a part of the generated address values and the corresponding lookup values and returns these, when possible, without using the table. This allows to reduce the power consumption and/or electric noise generated by the circuit.

BRIEF DESCRIPTION OF THE DRAWINGS

Further embodiments, advantages and applications of the invention are disclosed in the following description with reference to the figures, in which.

Further embodiments, advantages and applications of the invention are given in the dependent claims and the now following description with reference to the figures, which show:

WAYS FOR CARRYING OUT THE INVENTION

Figure 1:
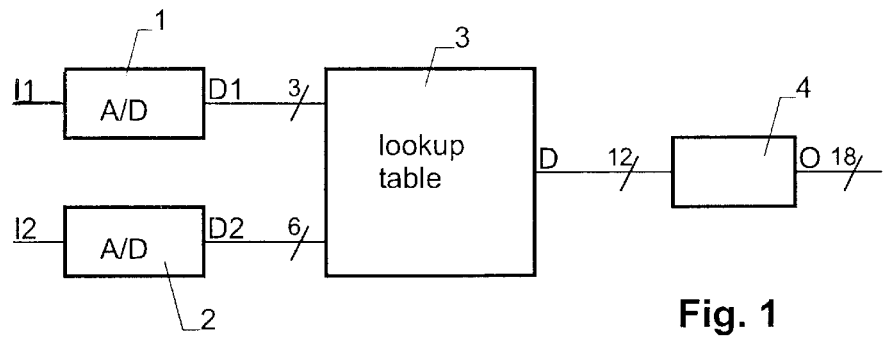
FIG. 1 a simplified block diagram of an A/D-converter according to the invention, FIG. 2 a first specific embodiment of the invention with offset correction, FIG. 3 a second specific embodiment of the invention with reduced table size, and FIG. 4 a block diagram of an embodiment with cache memory access.

The circuit of FIG. 1 shows an A/D-converter with two analog inputs I1, I2 and a digital output, wherein the output value O is a function of both input values. Such a circuit can e.g. be used in a gas flow sensor that feeds the signal from the actual flow sensor to input I2 and, in addition to this, the signal of a temperature sensor to the input I1. The task of the A/D-converter is in this case to generate the effective gas flow as output signal O, wherein a non-linearity of the flow sensor as well as its temperature dependence is to be corrected.

For this purpose a converter 1 or 2, respectively, is arranged at each of the inputs I1, I2. These are analog-digital converters with low resolution. In the present case, they have a resolution of 3 or 6 bits respectively. The converters are designed in such a way that the digital values D1 and D2 generated by them have low resolution, but that the averages of D1 and D2 over several measurements converge to a value of higher resolution. Converters of this type are used in "oversampling" techniques and are e.g. so called incremental A/D-converters or $\Sigma\Delta$-converters.

The digital values D1 and D2 of the converters 1, 2 are fed to lookup table 3, which can be considered as a two dimensional array of data containing a lookup value D for each pair of values D1 and D2. It can, as described further below, be implemented as a memory circuit or an arithmetic unit. Since the values D1 and D2 are only 3 or 6 bits wide, the size of the table is comparatively small.

The lookup value D has in the present embodiment a resolution of 12 bit. It is fed to an integrator stage 4 used as a decimation filter, which filters several lookup values D, e.g. by addition or averaging, respectively, in order to increase the resolution of the measurement and generates an output value O of a width of e.g. 18 bits. This output value can, if required, be scaled, e.g. by cutting off the least significant bits.

Figure 2:
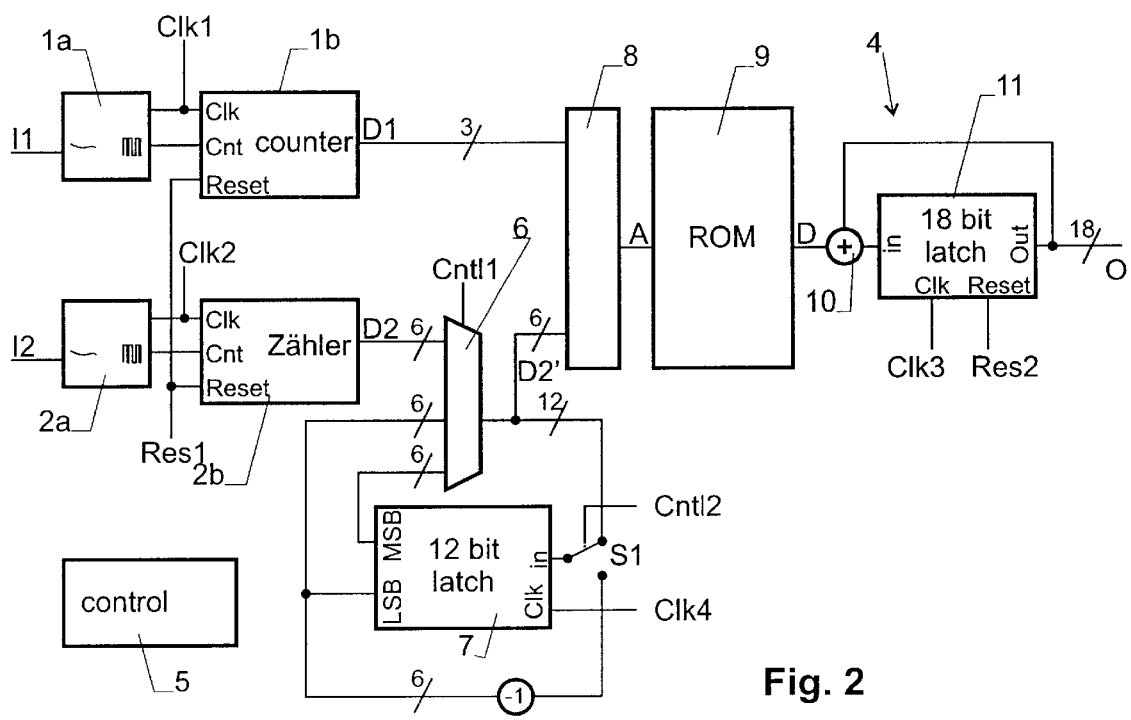

FIG. 2 shows a specific embodiment of a circuit according to the invention, which is equipped with an additional offset correction.

Here, the converters 1, 2 each consist of a incremental converter which can, where applicable, comprise an analog preprocessing stage. Each incremental converter comprises a digitizer 1a and 2a and a counter 1b, 2b, respectively. Digitizer 1a, 2a generates a binary value B1 or B2, respectively, from the input signal for each clock signal Clk1, Clk2, wherein the time-averaged number of the binary values B1, B2 with value 1 is proportional to the input value. The counter counts the binary values of value 1 generated during a measurement period and generates the digital value D1, D2. At the end of each measuring period, the counters 2a, 2b are reset by signal Res1.

In the present embodiment digital value D1 is of lower resolution (e.g. 3 bits) than digital value D2 (6 bits) because the latter requires a stronger correction. The second converter 2a, 2b is therefore driven by an eight times higher clock rate than the first converter 1a, 1b such that the measuring periods of both converters have the same length, or both converters are driven with the same clock rate and are equipped with counters of the same length, but only the most significant bits of counter 1b are used for further processing, or the counter stops after the desired number of bits. For generating all clock and control signals, a control 5 is provided.

In the embodiment of FIG. 2 the measuring value D2 is fed to an offset compensation, which substantially consists of an arithmetic unit 6 and a register or value memory 7.

The offset compensation has a correction mode and a normal mode controlled by control inputs Cntl1 and Cntl2. In correction mode, the offset of the digital values D2 is determined, in normal mode normal measurements are carried out and the offset in the digital values D2 is compensated for generating compensated digital values D2'. These modes are described in the following:

In the correction mode, the analog input I2 is set to 0 (or another predetermined value). If the device comprises an analog stage before analog input I2, e.g. an amplifier, it is also possible to set the input of the analog stage to 0 in order to take account of its offset. The digital values D2 determined in this way are fed to the arithmetic unit 6. In this mode of operation, the arithmetic unit adds the 6 bits digital value D2 to a 12 bits digital value consisting of six least significant bits LSB and six most significant bits MSB coming from register 7. The sum is fed as a 12 bit value over a switch S1 to the input of register 7. At the end of each measuring period of the converter 2a, 2b, a clock signal Clk4 is generated and the value generated in this way is stored in register 7 and appears as a 12 bit correction word k at the outputs MSB, LSB in order to be added to the next digital value D2. In this way, the digital values D2 (which should be 0 without offset) are added up in the counter.

The correction mode extends over $n=2^6$ measuring periods of converter 2a, 2b in order to obtain a correction word k of high resolution. Then the circuit is switched back to normal mode.

In normal mode, the arithmetic unit 6 subtracts a correction value of the value k div n from the digital value D2. As n is a integer power of 2, the value k div n corresponds to the most significant bits of the correction word k, in the present case to the six most significant bits designated as MSB. In addition to this, the arithmetic unit 6 subtracts the value 1 from the digital value D2 if the six least significant bits of register 7 designated as LSB are larger than 0.

The digital value compensated in this way is then fed to the table.

At the beginning of the measuring mode, the value LSB is equal to k mod n. At the end of each measuring period, the least significant bits LSB in register 7 are decremented by 1 and stored back to the register 7 via the now redirected switch S1 such that the value LSB decreases by 1 after each measuring period. Hence, the value LSB is again k mod n after n measuring periods. Therefore, a new measuring cycle can start, or a new run in the correction modus can begin.

Hence, the first k mod n digital values out of n digital values D2 are additionally corrected downwards by 1. This results in a fine correction because a subtraction of k div n alone would lead to compensated digital values D2' that are, in an average, somewhat too high.

It must be noted that the subtraction operations in the offset correction circuit of FIG. 2 can be replaced by additions (or vice versa) if the same values with opposite sign as used.

In the circuit of FIG. 2 the compensated digital value D2' is fed together with the (in the present embodiment uncompensated) digital value D1 to a memory driver control 8 where the two values are combined to a 9 bit address A and fed to a memory 9. Memory 9 contains all values of the lookup table 3 and generates the lookup value D. (The digital values D1 and D2 can also form only part of the address A, wherein the other part of the address A is e.g. generated by a control signal selecting one of several tables in memory 9).

Lookup' value D is fed to the decimation filter or integration stage 4, which consists of an adder 10 and a register 11. Adder 10 adds the lookup value D and the value in register 11. The sum is stored by a clock signal Clk3 at the end of each measuring period in register D. After $2^6$ measuring periods, the output signal generated in this way, which corresponds to the sum of the last $2^6$ lookup values D, is forwarded to a register (not shown) at the output O, where, if desired, a division (or shift operation) is carried out for eliminating the least significant bits. Then register 11 is reset by a signal Res2.

In the circuit shown here memory 9 must hold at least $2^9$=512 values of a width of 12 bits. When compared to the high resolution that can be reached, this is a low value. However, by using suited circuitry the required storage capacity can, as shown by reference to the next embodiment, be reduced further, or an even higher resolution can be reached with the same storage capacity.

In the circuit of FIG. 1 the output value O is a function f of the analog input values I1, I2 or of the digital values D1, D2 respectively:

$$O=f(D1, D2). \quad (1)$$

D1 and D2 are integer values. If we assume that we know f(i, j) for a given value pair D1=i, D2=j, f for the next higher values i+1, j and i, j+1 can be calculated from $$f(i+1, j)=f(i, j)+S1+w1_{i+1, j} \quad (2)$$

$$f(i, j+1)=f(i, j)+S2+w2_{i, j+1}$$

Here, S1, and S2 are constant values, i.e. values independent of i and j, which give the average slope of f in D1 and D2. S1 and S2 can e.g. be obtained from a linear regression of f. $w1_{ij}$ and $w2_{ij}$ are comparatively small correction values quantifying the local deviation of the function f from a linear interpolation with the slopes S1 or S2, respectively:

$$w1_{i, j}=f(i, j)-f(i-1, j)-S1 \quad (3)$$

$$w2_{i, j}=f(i, j)-f(i, j-1)-S2$$

The basic idea of the second embodiment of the invention is to store, in the table, the correction values $w1_{ij}$ and $w2_{ij}$ instead of the function values f(i,j), which is described in the following.

Figure 3:
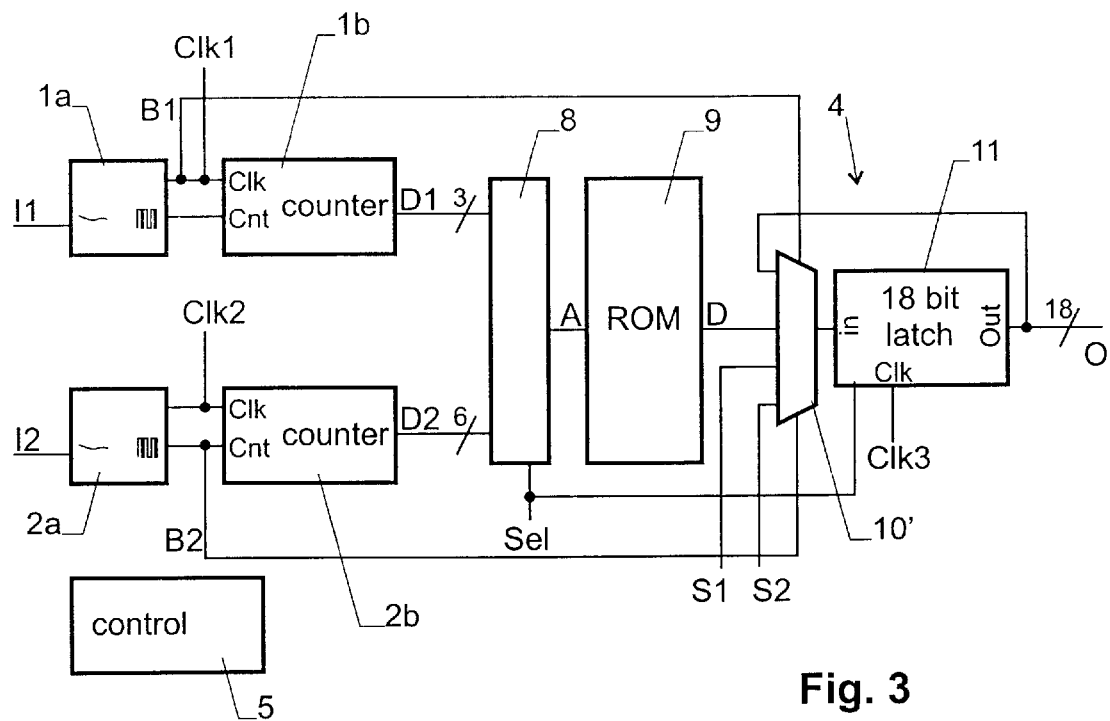

The embodiment of FIG. 3 comprises no offset correction and adder 10 has been replaced by an arithmetic unit 10'. In contrast to the first embodiment, integrator 4 is operated at a much higher clock rate and accesses to memory 9 are more frequent. Clock signal Clk3 of integrator 4 is designated in the following as reference clock, and the corresponding clock rate as reference clock rate.

The clock rates Clk1 and Clk2 for the adders 1b and 2b are running at the half reference clock rate and are mutually phase shifted by 180°.

In memory 9 the correction values $w1_{ij}$ and $w2_{ij}$ are stored. A control signal Sel, which is also operated at half of the reference clock rate, indicates to memory driver control 8 by its value if $w1_{i,j}$ or $w2_{i,j}$ is to be retrieved, wherein the indices i, j correspond to the momentary values of D1 and D2, respectively. For the following example it is assumed that $w1_{i,j}$ as retrieved for Sel=0 and $w2_{i,j}$ for Sel=1.

The linearization values S1, S2, the output value D of memory 9 and the output value O of register 11 are fed to arithmetic unit 10'. Furthermore, the binary signals B1 and B2 as well as the control signal Sel are fed as congtrol signals to the memory driver control. Depending on these values memory arithmetic unit 10' generates the following results:

| Sel | B1 | B2 | Result | Note |
|---|---|---|---|---|
| 0 | 0 | x | O | D = w1 |
| 0 | 1 | x | O + S1 + D | D = w1 |
| 1 | x | 0 | O | D = w2 |
| 1 | x | 1 | O + S2 + D | D = w2 |

(where "x" means that the corresponding value has no influence on the result).

Hence, control signal Sel indicates if B1 or B2 are to be examined. If the binary value B1 or B2 that is to be examined is 0, arithmetic unit 10' feeds the output signal O to the input of register 11, if it is 1, the result is equal to O+S1+w1 or O+S2+w2, respectively.

The circuit of FIG. 3 works as follows:

At the beginning of a measurement period the counters 1b, 2b and register 11 are set to 0. Then a first clock pulse is applied to counter 1b. If the corresponding binary value B1=1, the counter is increased. With the control signal Sel=0 it is indicated to memory 9 that it has to retrieve the value $w_{10}$. This value is fed to arithmetic unit 10', which calculates according to the above table the output value $O+w_{10}+S1$ which is stored by means of a clock pulse Clk3 in register 11.

If, however, B1=0, the output signal of the arithmetic unit 10' is equal to O, i.e. the value of register 11 remains unchanged at 0.

In a next cycle Sel is 1 and a clock pulse is applied to counter 2b. In memory 9 $w_{01}$ is retrieved and, if B2=1, added to O together with S2.

This procedure repeats until the end of the measuring period. If, for example, D1=i and D2=j and counter 1b is incremented by 1, O is increased by the value $S1+w_{i+1,j}$ according to equation (2). Hence, at the end of a measuring period O is equal to f(D1, D2).

The counters 1b, 2b are reset for the next measuring period, but not register 11. Rather, the results of several measuring periods are added up in register 11 such that, as in the embodiment of FIG. 2, the resolution of the output value is increased.

At the end of e.g. $2^6$ measuring periods, the output value is stored in an output register, which is not shown (and, if applicable, scaled) and register 11 is reset.

In the above embodiments it is assumed that the output signal for I1=I2=0 should also be 0. If not, register 11 can be set to a non-zero starting value at the begin of a measuring period, which starting value corresponds to the basic offset times $2^6$.

Due to the recursive calculation according to equation (2), memory 9 only has to store the deviations of the function f from a linear behavior. These deviations are, as a rule, substantially smaller than the function values themselves such that they can be stored with smaller resolution or bit length, respectively.

It is also possible to set the constants S1 and S2 to 0. In this case, the design of arithmetic unit 10' becomes easier. In this case, memory 9 would hold the differences of consecutive function values f.

Figure 4:
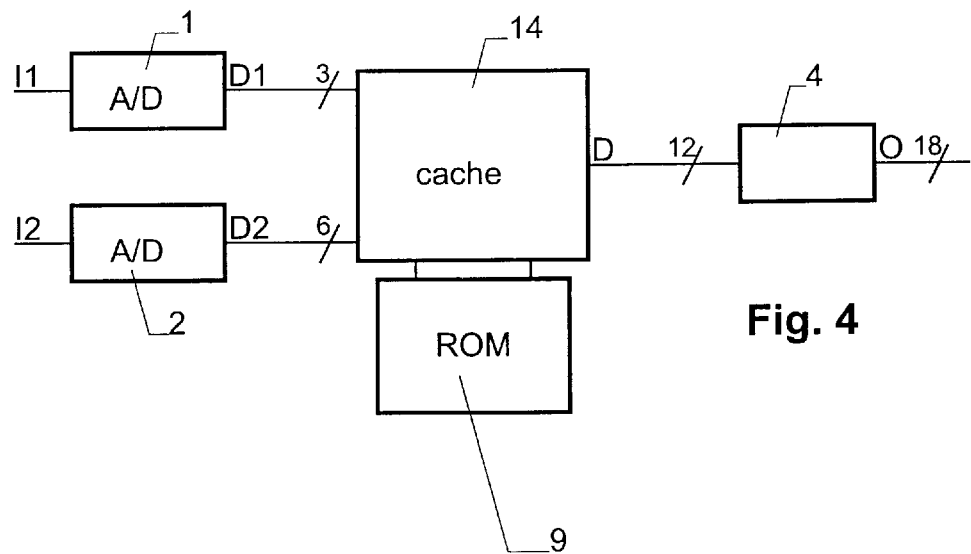

A further embodiment of the invention is shown schematically in FIG. 4. As an extension of the concept of FIGS. 1, 2 or 3 the lookup table is here implemented as a memory 9 driven by means of a cache control 14. Cache control 14 stores in known manner the last or most often accessed memory values and their addresses. In this way the number of accesses to the memory is decreased. This reduces its power consumption and the electric noise generated by it.

While, in the present application, preferred embodiments of the invention are shown, it must be pointed out clearely that the invention is not limited thereto and can also be carried out in different manner within the scope of the following claims.

What is claimed is:

1. An A/D-converter comprising
   at least a first and a second analog input for analog input values, wherein each input is connected to a converter for generating a first and a second digital value, respectively,
   a table arrangement for generating a lookup value from the digital values, and
   a decimation filter for generating an output value from several consecutive lookup values by addition or averaging, such that the output value (O) has a higher resolution than the lookup value (D).

2. The A/D-converter of claim 1 further comprising a correction circuit for offset compensation for at least one of the inputs, which adds or subtracts a correction value to/from the digital value to be compensated for generating a corrected digital value.

3. The A/D-converter of claim 1 wherein the digital values are proportional to the corresponding input value.

4. The A/D-converter of claim 1 wherein each converter comprises a digitizer and a filter, wherein each digitizer generates a series of binary values, wherein the number of binary values with value 1 is proportional to the input value, and the filter counts the number of binary values of value 1 within a measuring period for generating the digital value.

5. The A/D-converter of claim 4 wherein the filters are designed as counters, wherein the table device supplies difference values depending on the values of the counters, and wherein the decimation filter is designed as an integration stage for adding the lookup value from the table to an intermediate result at each increment of one of the counters.

6. The A/D-converter of claim 5 wherein the decimation filter supplies the intermediate result after an integration period as an output value, wherein the integration period comprises several measuring periods.

7. The A/D-converter of claim 5 wherein the filters are designed as counters and wherein the integration stage is designed to add the lookup value from the table to the intermediate result and to a proportionality constant upon each increment of one of the counters, wherein the value of the proportionality constant depends on which one of the counters was incremented.

8. The A/D-converter of claim 1 wherein the table device comprises a memory with address input, and wherein the digital values, where applicable after an offset correction, are fed as addresses or part of addresses to the address input.

9. The A/D-converter of claim 8 wherein a cache circuit is provided that caches a part of the generated addresses and the corresponding lookup values for reducing the number of accesses to the memory.

10. The A/D-converter of claim 1 wherein the converters are incremental A/D-converters or a $\Sigma\Delta$-converter.

11. An A/D-converter comprising
    at least one analog input for an analog input value, wherein the input is connected to a converter for generating a digital value,
    a table arrangement, which transforms the digital value in nonlinear manner into a lookup value,
    a decimation filter for generating an output value from several consecutive lookup values such that the output value has higher resolution than the lookup-value,
    a correction circuit for offset compensation, which adds or subtracts a correction value to/from the digital value for generating a corrected digital value, and
    an offset detector for measuring the offset of the digital values to be compensated at a known input value at the input, wherein the offset detector is designed for adding up the offset of n digital values and generating a correction word k therefrom, which has higher resolution than the digital values, and wherein the offset compensation is designed for adding or subtracting the correction word k divided by n to/from each digital value to be compensated.

12. The A/D-converter of claim 11 wherein the offset compensation is designed for subtracting the value k div n from each digital value to be compensated and, in addition, subtracting totally the value k mod n from a group of n digital values to be compensated.

13. The A/D-converter of claim 12 wherein the offset compensation is designed to subtract the value 1 from totally k mod n digital values of the group.

14. The A/D-converter of claim 13 wherein a counter is provided for counting the k mod n digital values from which the value 1 is to be subtracted.

15. The A/D-converter of claim 11 wherein $n=2^z$ and wherein z is a natural number larger than 1.

* * * * *